United States Patent
Ha

(10) Patent No.: US 7,901,849 B2
(45) Date of Patent: Mar. 8, 2011

(54) PHOTOMASK AND METHOD OF FABRICATING THE SAME

(75) Inventor: Tae Joong Ha, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 248 days.

(21) Appl. No.: 12/346,973

(22) Filed: Dec. 31, 2008

(65) Prior Publication Data

US 2009/0253052 A1 Oct. 8, 2009

(30) Foreign Application Priority Data

Apr. 7, 2008 (KR) .......................... 10-2008-0032288

(51) Int. Cl.
*G03F 1/00* (2006.01)

(52) U.S. Cl. ............................................. 430/5
(58) Field of Classification Search .................. 430/5
See application file for complete search history.

(56) References Cited

U.S. PATENT DOCUMENTS

| | | | |
|---|---|---|---|
| 7,060,400 B2 | 6/2006 | Wang et al. | |
| 7,465,524 B2 | 12/2008 | Park et al. | |
| 2008/0187841 A1 * | 8/2008 | Wang | 430/5 |

* cited by examiner

*Primary Examiner* — Mark F Huff
*Assistant Examiner* — Rashid Alam
(74) *Attorney, Agent, or Firm* — Marshall, Gerstein & Borun LLP

(57) ABSTRACT

A photomask comprises: a light transmitting substrate; patterns disposed over the light transmitting substrate to define a light transmitting region; and a light transmittance control layer disposed between the light transmitting substrate and the patterns having a relatively high light transmittance in a first control layer region overlapping a first portion of the light transmitting region adjacent to a poor pattern having a size larger than a normal size than in a second control layer region overlapping a second portion of the light transmitting region between normal patterns having a normal size.

11 Claims, 5 Drawing Sheets

PHOTOMASK AND METHOD OF FABRICATING THE SAME

CROSS-REFERENCE TO RELATED APPLICATION

Priority to Korean patent application number 10-2008-0032288, filed on Apr. 7, 2008, the entire disclosure of which is incorporated herein by reference, is claimed.

BACKGROUND OF THE INVENTION

The invention relates to a photomask used in an exposure process for fabricating a semiconductor device and a method of fabricating the same.

In general, a semiconductor device is realized through various patterns on a wafer, and these patterns are formed using a photolithography process. According to a conventional photolithography process, a photoresist layer is formed on a layer to be patterned on a wafer and a predetermined portion is exposed using a photomask. Next, a photoresist layer pattern that exposes some of a surface of the layer to be patterned is formed by removing a portion of the photoresist layer, the solubility of which is changed or unchanged by the exposure, in a development process using a developing solution. Then, a pattern is formed by removing the exposed portion of the layer to be patterned by etching using the photoresist layer pattern as an etch mask. In this procedure, the pattern formed on the wafer is defined by the photoresist layer pattern and the photoresist layer pattern is formed as the pattern on the photomask is transferred thereto. Therefore, the pattern on the photomask layer is consequently transferred to the pattern on the wafer.

However, as the degree of integration of semiconductor devices increases, the sizes of pattern of photomasks are also gradually becoming miniaturized. Due to this tendency, various problems may be generated in the procedure of forming fine patterns of a photomask pattern. One of the typical problems is a pattern critical dimension (CD) error by which the pattern size of the photomask is not accurately formed. This pattern CD error may be generated by an exposure apparatus or in a procedure of performing the exposure process. When this pattern CD error is generated, the photoresist layer pattern to which the pattern of the photomask is transferred is not formed to a desired size and, consequently, the pattern on the wafer is also not formed to a desired shape.

SUMMARY OF THE INVENTION

Embodiments of the invention are directed to a photomask capable of compensating a pattern CD error of the photomask even though the pattern CD error is generated, and a method of fabricating the photomask.

In one embodiment, a photomask comprises: a light transmitting substrate; patterns disposed over the light transmitting substrate to define a light transmitting region of the substrate; and a light transmittance control layer disposed between the light transmitting substrate and the patterns, the control layer having a relatively high light transmittance in a first control layer region overlapping a first portion of the light transmitting region adjacent to a poor pattern having a size larger than a normal size, said control layer having a relatively low light transmittance in a second control layer region overlapping a second portion of the light transmitting region disposed between normal patterns having a normal size.

The light transmittance control layer preferably comprises a material having light transmittance that varies with an oxidation level of the material. In this case, the light transmittance control layer preferably comprises a material having a relatively high light transmittance in an oxidized portion of the layer compared to a non-oxidized portion of the layer. In an example, the light transmittance control layer preferably comprises cobalt (Co), silicon (Si), tantalum (Ta), or molybdenum (Mo).

The light transmittance control layer preferably has a structure wherein the first region is oxidized.

The patterns preferably comprise light blocking layer patterns or a phase shift layer pattern.

In another embodiment, a photomask comprises: a light transmitting substrate; patterns disposed over a first surface of the light transmitting substrate to define a light transmitting region; and a light transmittance control layer disposed over a second surface of the light transmitting substrate opposed to the first surface and having a relatively high light transmittance in a first control layer region overlapping a first portion of the light transmitting region adjacent to a poor pattern having a size lager than a normal size than in a second region overlapping a second portion of the light transmitting region between normal patterns having a normal size.

In another, further embodiment, a method of fabricating a photomask comprises: forming a light transmittance control layer having a light transmittance controlled by an oxidation level thereof over a light transmitting substrate; forming patterns defining a light transmitting region over the light transmittance control layer; measuring a critical dimension (CD) error of a poor pattern having a size larger than a normal size by inspecting a CD of the patterns; calculating the oxidation level of the light transmittance control layer by analyzing the measured CD error; and selectively oxidizing a portion of the light transmittance control layer overlapping the light transmitting region adjacent to the poor pattern by the calculated oxidation level.

The light transmittance control layer preferably comprises a cobalt (Co), silicon (Si), tantalum (Ta), or molybdenum (Mo) material.

The patterns are preferably formed of light blocking layer patterns or a phase shift layer pattern.

Calculating the oxidation level of the light transmittance control layer by analyzing the measured CD error preferably comprises: calculating a CD correction amount by comparing the measured CD with a reference value; calculating a transmittance corresponding to the calculated CD correction amount; and calculating the oxidation level corresponding to the calculated transmittance.

Selectively oxidizing the light transmittance control layer is preferably performed using a thermal oxidation method or an oxygen ion implantation method.

In yet another, further embodiment, a method of fabricating a photomask comprises: forming a light transmittance control layer having a light transmittance controlled by an oxidation level thereof over a rear surface of a light transmitting substrate; forming patterns defining a light transmitting region over a front surface of the light transmittance control layer; measuring a critical dimension (CD) error of a poor pattern having a size larger than a normal size by inspecting a CD of the patterns; calculating the oxidation level of the light transmittance control layer by analyzing the measured CD error; and selectively oxidizing a portion of the light transmittance control layer overlapping the light transmitting region adjacent to the poor pattern by the calculated oxidation level.

According to the invention, even though poor patterns having sizes larger than a normal size are generated in a process of fabricating the photomask, the light transmittance of the portion having the poor patterns can be increased by oxidizing a portion of a light transmittance control layer having the poor patterns and it is consequently possible to obtain pattern transfer of desired profile.

DESCRIPTION OF SPECIFIC EMBODIMENTS

Hereinafter, a photomask and a method of fabricating the photomask in accordance with the invention will be described in detail with reference to the accompanying drawings.

Figure 1:
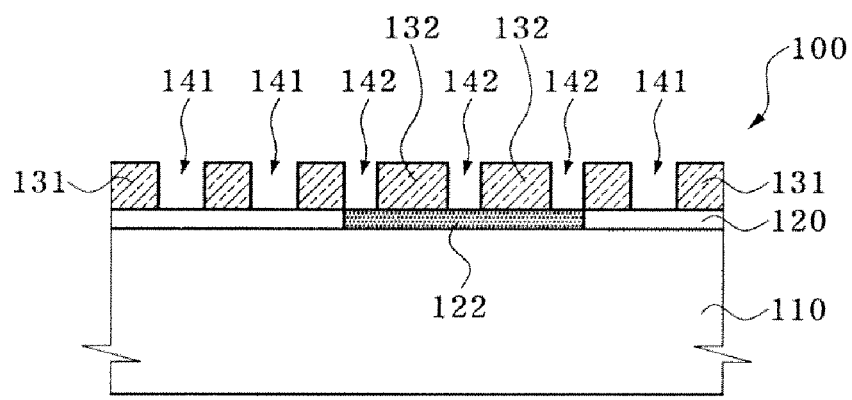
FIG. 1 is a cross-sectional view illustrating a photomask according to an embodiment of the invention.

FIG. 1 is a cross-sectional view illustrating a photomask according to an embodiment of the invention. Referring to FIG. 1, in a photomask according to the present embodiment, a light transmittance control layer 120 is disposed over a light transmitting substrate 110, such as quartz, for example. Over the light transmittance control layer 120, light blocking layer patterns 131, 132 are disposed. The light transmittance control layer 120 is formed of a material having a light transmittance which varies as a function of the oxidation level of the material, and an oxidized region 122 of the control layer 120 has been oxidized. The light transmittance in the oxidized region 122 is relatively higher than the light transmittance in other regions. Though a binary photomask having the light blocking layer patterns 131, 132 is illustrated herein, a phase shift mask having phase shift layer patterns instead of the light blocking layer patterns 131, 132 may be used, if desired. Also, though the light transmittance control layer 120 is present over the surface of the surfaces of the light transmitting substrate 110 on which the light blocking layer patterns 131, 132 are disposed in the present embodiment, in some cases, the light transmittance control layer 120 may be disposed over the surface of the substrate opposed to the surface on which the light blocking layer patterns 131, 132 are disposed in FIG. 1, i.e. over the rear surface of the light transmitting substrate 110.

The light transmittance control layer 120 preferably comprises cobalt (Co), silicon (Si), tantalum (Ta), or molybdenum (Mo) material. The light transmittance control layer 120 made of such a material shows a property that a light transmittance is relatively high in an oxidized portion compared to a non-oxidized portion. For example, in a case that the light transmittance control layer 120 has a light transmittance of 90%, when oxidizing some portion of the light transmittance control layer 120, the oxidized portion may show a transmittance of 90% to 100%, though there is a difference according to the oxidation level. The transmittance of the light transmittance control layer 120 in a non-oxidized state may be suitably selected by controlling a thickness of the light transmittance control layer 120. For example, in a case that the light transmittance control layer 120 is formed of chrome, the light transmittance control layer 120 shows the transmittance of almost 0 when formed in a thickness of about 590 Å but about 90% when formed in a thickness of about 59 Å. Therefore, the transmittance of the non-oxidized portion of the light transmittance control layer 120 is determined by selection of material and thickness thereof.

The light blocking layer patterns 131, 132 mostly include normal light blocking layer patterns 131 formed in a normal size in a process of fabricating the photomask 100, but also include poor light blocking layer patterns 132 having a size larger than the normal size in a process of fabricating the photomask 100, resulting in a critical dimension (CD) error. The poor light blocking layer patterns 132 may be formed by an exposure apparatus or in an exposure process, or may be formed due to properties of a resist layer used to form the light blocking layer patterns 131, 132. When the poor light blocking layer patterns 132 are formed, a light transmitting region portion 142 adjacent to the poor light blocking layer pattern 132 becomes relatively narrower than a light transmitting region portion 141 between the normal light blocking layer patterns 131. Consequently, a quantity of light passing through the light transmitting region portion 141 becomes smaller than the quantity of light passing through the light transmitting region portion 142.

Therefore, in order to correct this deviation in the quantity of light, a portion of the light transmittance control layer 120 that overlaps the light transmitting region portion 142 adjacent to the poor light blocking layer pattern 132 is disposed as an oxide layer 122. As described above, the light transmittance of the transmittance control layer 120 is larger in the oxidized region 122 than in the non-oxidized region. Therefore, while the transmittance control layer 120 having relatively wide width and relatively low light transmittance is disposed in the light transmitting region portion 141, the transmittance control layer 120 having relatively narrow width and relatively high light transmittance is disposed in the light transmitting region portion 142. Therefore, by controlling an increasing level of the light transmittance in the oxidized region 122, i.e. oxidation level of the oxidized region 122 so as to correspond to the CD correction amount in the poor light blocking layer pattern 132, it is possible to make the light quantity transmitting the light transmitting region portion 141 and the light quantity transmitting the light transmitting region portion 142 to be equal. Consequently, even when the poor light blocking layer pattern 132 is present, it is possible to perform an exposure process as same as when only normal light blocking layer pattern 132 is present.

Figure 2:
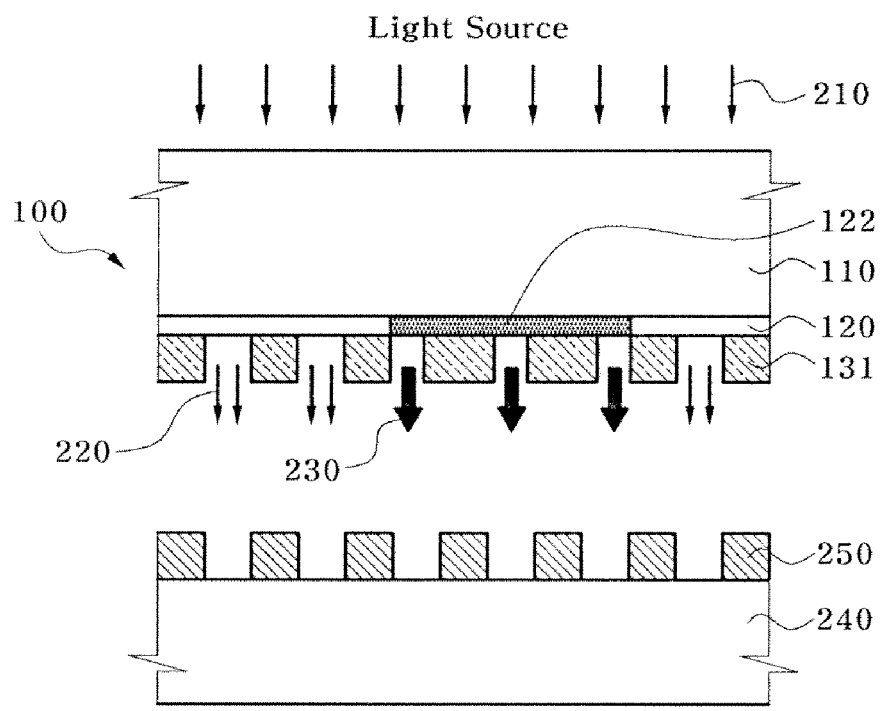
FIG. 2 is a view illustrating a patterning procedure using the photomask in FIG. 1.

FIG. 2 is a view illustrating a patterning procedure using the photomask in FIG. 1. Referring to FIG. 2, light is irradiated from a light source as shown by arrows 210 and this light is irradiated to a wafer 240 through the light transmitting region of the photomask 100. At this time, in a case of the light passing through the light transmitting region between the normal light blocking layer patterns 131, as shown by thin arrows 220, the light of a desired quantity is irradiated to the wafer 240 by a relatively wide transmitting area of the light transmitting region portion 141 (not shown in FIG. 2). Also, in a case of the light passing through the light transmitting region portion 142 (not shown in FIG. 2) adjacent to the poor light blocking layer pattern 132, as shown by thick arrows 230, the light of a desired quantity is irradiated to the wafer 240 despite the relatively narrow area of the second transmitting area since the light transmittance is higher in the oxidized region 122 of the light transmittance control layer 120. Therefore, the light quantity irradiated to the wafer 240 can be maintained uniformly across the entire light transmitting region even when the poor light blocking layer pattern 132 is generated in the process of fabricating the photomask 100. As the result, a pattern 250 finally formed over the wafer 240 is formed as a normal pattern corresponding to the normal light blocking layer pattern 131 across the entire region.

Figure 3:
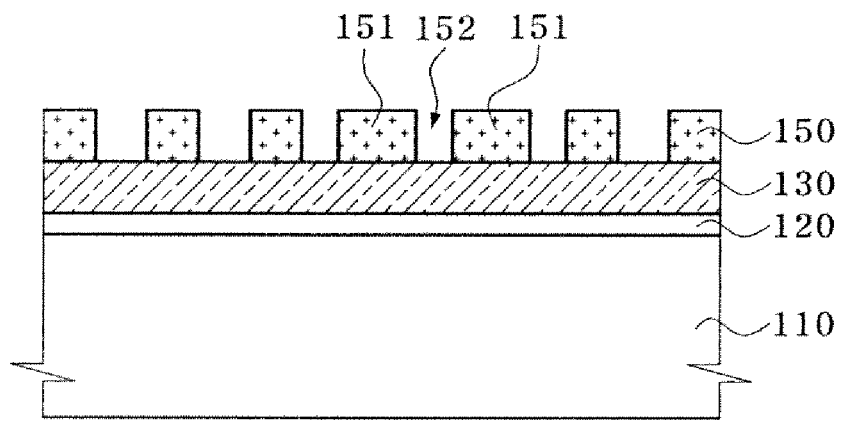
FIGS. 3 through 5 are cross-sectional views illustrating a method of fabricating a photomask according to an embodiment of the invention.
Figure 4:
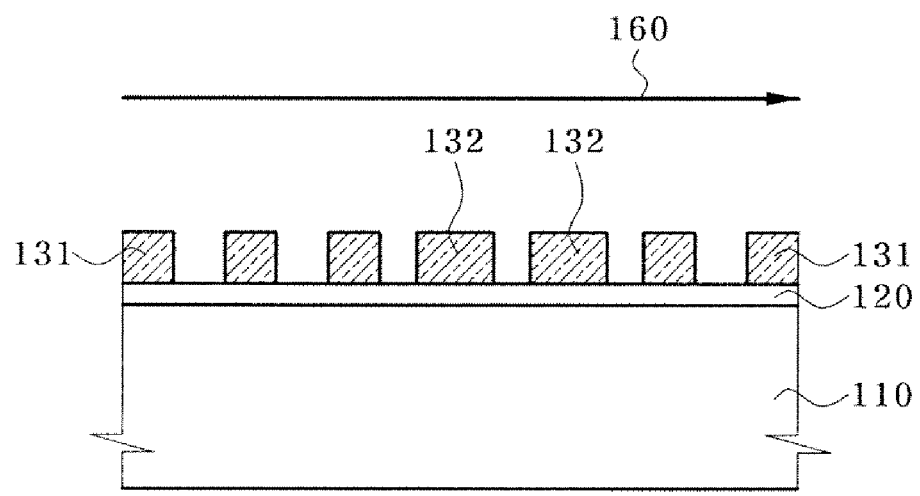
Figure 5:
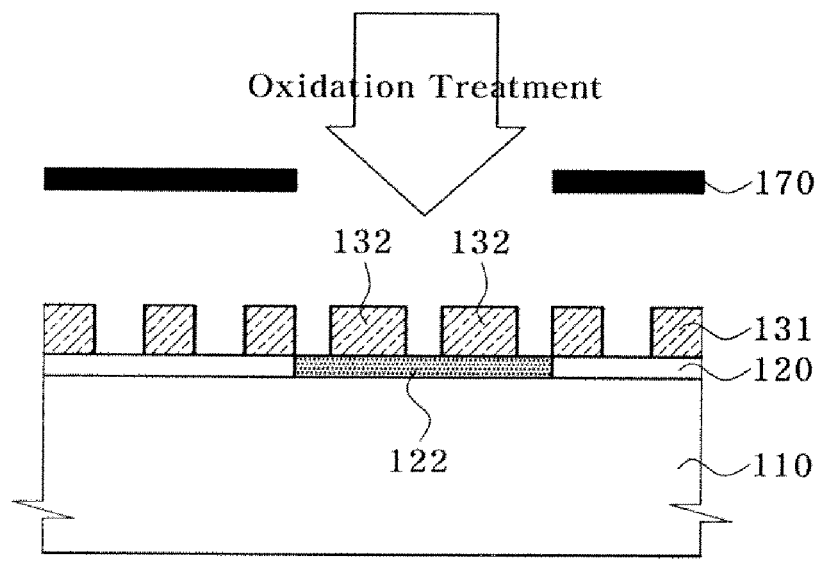

FIGS. 3 through 5 are cross-sectional views illustrating a method of fabricating a photomask according to an embodiment of the invention. Specifically, in order to fabricate a binary type photomask, as shown in FIG. 3, the light transmittance control layer 120 is first formed over the light transmitting substrate 110, such as quartz, for example. Although the light transmittance control layer 120 is formed over a front surface of the light transmitting substrate 110, the light transmittance control layer 120 may be formed over the rear surface of the light transmitting substrate 110 in some cases. In this case, the process procedure hereinafter is the same, except that the light transmittance control layer 120 is not placed over the front surface, but rather over the rear surface of the light transmitting substrate 110. The light transmittance control layer 120 is preferably formed of a material of having light transmittance that varies as a function of the oxidation level of the material, for example, cobalt (Co), silicon (Si), tantalum (Ta), or molybdenum (Mo) material. As the light transmittance control layer 120 is more highly oxidized, the transmittance increases. Next, a light blocking layer 130 is formed over the light transmittance control layer 120. The light blocking layer 130 is preferably but not necessarily formed of chrome (Cr). A resist layer pattern 150 is formed over the light blocking layer 130. The resist layer pattern 150 has an opening 152 that exposes the light blocking layer 130 of the light transmitting region. The resist layer pattern 150 is preferably formed through an exposure and development process using a conventional electron beam or laser, and a poor resist layer pattern 151 of an abnormal CD may be formed in this procedure.

Next, as shown in FIG. 4, the light blocking layer patterns 131, 132 are formed by removing the exposed portion of the light blocking layer (130 in FIG. 3) with an etch process using the resist layer pattern (150 in FIG. 3) as an etch mask. Then, the resist layer pattern 150 is removed. It is normal that the light blocking layer patterns 131, 132 are formed only of the normal light blocking layer pattern 131, but the poor light blocking layer pattern 132 out of the normal CD is also generated when the poor resist layer pattern (151 in FIG. 3) is generated in the procedure of forming the resist layer pattern 150. Although generation of the poor light blocking layer pattern 132 resulting from the poor resist layer pattern (151 in FIG. 3) is illustrative in the present embodiment, the poor light blocking layer pattern 132 out of the normal CD may be generated when a process is abnormally performed in the process of etching the light blocking layer 130 even in the case that the resist layer pattern 150 is normally formed. Next, as shown by an arrow 160, scanning with respect to the light blocking patterns 131, 132 is performed to confirm presence of the poor light blocking pattern 132 and to measure the CD error of the poor light blocking pattern 132 when the poor light blocking pattern 132 is present. Next, a CD to be corrected is calculated by comparing the measured CD error with a reference value, e.g. the CD of the normal light blocking layer pattern 131. Then, a light transmittance corresponding to the calculated CD correction amount is calculated. The light transmittance calculation is preferably performed using a previously prepared table that defines a relationship between the CD correction amount and the transmittance. This table may be prepared by measuring CD deviation and the transmittance respectively while performing an actual exposure. Next, an oxidation level corresponding to the calculated transmittance is calculated. This procedure is also preferably performed by a previously prepared table that defines a relationship between the transmittance and the oxidation level.

Next, as shown in FIG. 5, oxidation treatment is selectively performed by the calculated oxidation level on some portion of the light transmittance control layer 120, i.e. the light transmitting region adjacent to the poor light blocking pattern 132. The light transmittance in the oxidized region 122 formed by the oxidation treatment is increased as compared to the light transmittance in the non-oxidized region. The oxidation treatment is preferably performed using an oxygen ion implantation using a blocking layer 170. In another example, the oxidation treatment is preferably performed using a thermal oxidation method.

Figure 6:
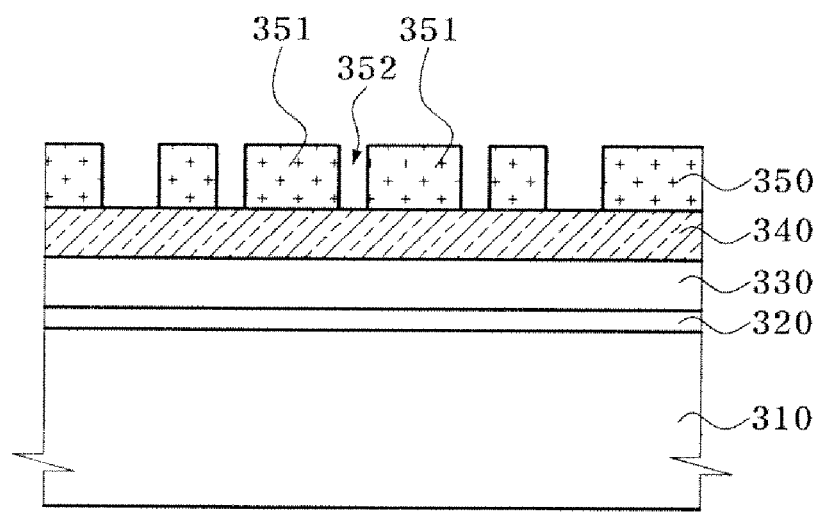
FIGS. 6 through 10 are cross-sectional views illustrating a method of fabricating a photomask according to another embodiment of the invention.

FIGS. 6 through 10 are cross-sectional views illustrating a method of fabricating a photomask according to another embodiment of the invention. Specifically, in order to fabricate a phase shift type photomask, as shown in FIG. 6, a light transmittance control layer 320 is first formed over a light transmitting substrate 310, such as quartz, for example. Although the light transmittance control layer 320 is formed over a front surface of the light transmitting substrate 310, the light transmittance control layer 320 may be formed over a rear surface of the light transmitting substrate 310 in some cases. In this case, the process procedure hereinafter is the same, except that the light transmittance control layer 320 is not placed over the front surface but rather over the rear surface of the light transmitting substrate 310. The light transmittance control layer 320 is preferably formed of a material having a light transmittance that varies as a function of the oxidation level of the material, for example, cobalt (Co), silicon (Si), tantalum (Ta), or molybdenum (Mo) material. As the light transmittance control layer 320 is more highly oxidized, the transmittance increases. Next, a phase shift layer 330 and the light blocking layer 340 are sequentially formed over the light transmittance control layer 320. The phase shift layer 330 and the light blocking layer 340 are preferably but not necessarily respectively formed of a molybdenum silicon oxynitride (MoSiON) layer and a chrome (Cr) layer. A resist layer pattern 350 is formed over the light blocking layer 340. The resist layer pattern 350 has an opening 352 that exposes the light blocking layer 340 of the light transmitting region. The resist layer pattern 350 is preferably formed through an exposure and development process using conventional electron beam or laser, and a poor resist layer pattern 351 of an abnormal CD may be formed in this procedure.

Figure 7:
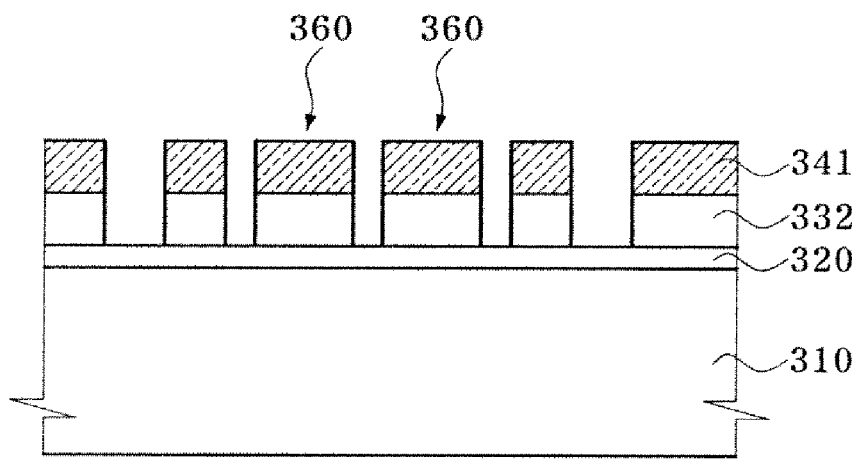

Next, as shown in FIG. 7, with an etch process using the resist layer pattern (350 in FIG. 6) as an etch mask, the light blocking layer pattern 342 is formed by removing the exposed portion of the light blocking layer (340 in FIG. 6) and subsequently a phase shift layer pattern 332 is formed by removing the exposed portion of the phase shift layer (330. in FIG. 6). Then, the resist layer pattern 350 is removed. It is normal that the phase shift layer pattern 332 and the light blocking layer pattern 342 are formed only of the normal pattern having a normal CD, but the poor pattern 360 out of the normal CD is also generated when the poor resist layer pattern (351 in FIG. 6) is generated in the procedure of forming the resist layer pattern 350. Although generation of the poor pattern 360 resulting from the poor resist layer pattern (351 in FIG. 6) is illustrative in the present embodiment, the poor pattern 360 out of the normal CD may be generated when a process is abnormally performed in the process of etching the light blocking layer 340 or the phase shift layer 330 even in the case that the resist layer pattern 350 is normally formed.

Figure 8:
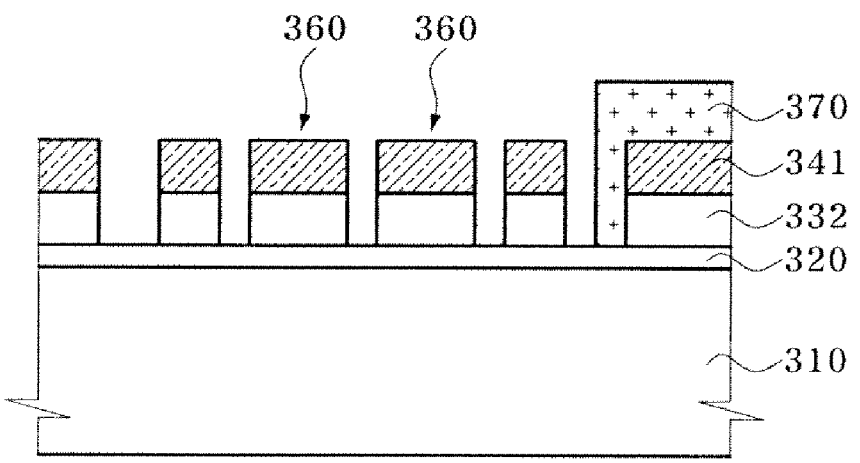

Next, as shown in FIG. 8, in order to selectively remove the light blocking pattern 342, a resist layer pattern 370 is formed in a predetermined region, e.g. in a frame region. Then, the exposed light blocking layer pattern 342 is removed by performing an etch using the resist layer 370 as an etch mask. After selectively removing the light blocking layer pattern 342, the resist layer pattern 370 is removed.

Figure 9:
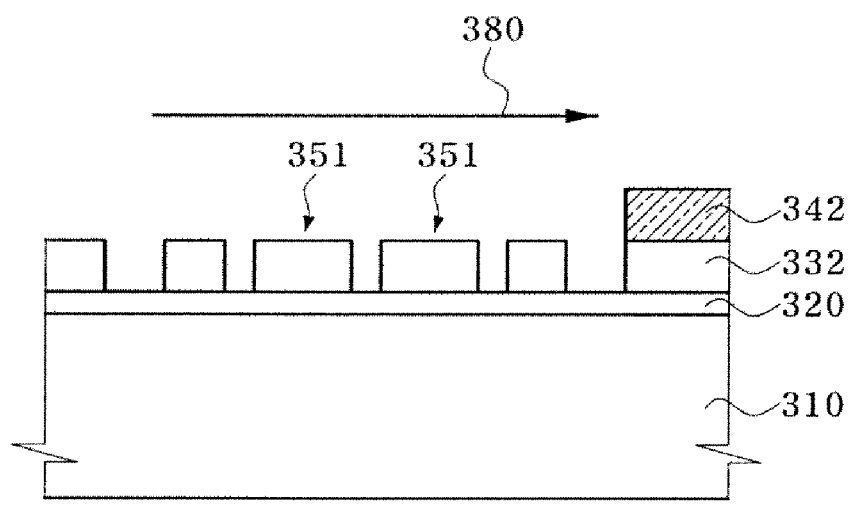

Next, as shown by an arrow 380 in FIG. 9, scanning with respect to the phase shift layer pattern 332 is performed to confirm presence of the poor phase shift layer pattern 351 and to measure the CD error of the poor phase shift layer pattern 351 when the poor phase shift layer pattern 351 is present. Next, a CD to be corrected is calculated by comparing the measured CD error with a reference value, e.g. the CD of the normal phase shift layer pattern 132. Then, a light transmittance corresponding to the calculated CD correction amount is calculated. The transmittance calculation is preferably performed using a previously prepared table that defines a relationship between the CD correction amount and the transmittance. This table is preferably prepared by measuring CD deviation and the transmittance respectively while performing an actual exposure. Next, an oxidation level corresponding to the calculated transmittance is calculated. This procedure is also preferably performed using a previously prepared table that defines a relationship between the transmittance and the oxidation level.

Figure 10:
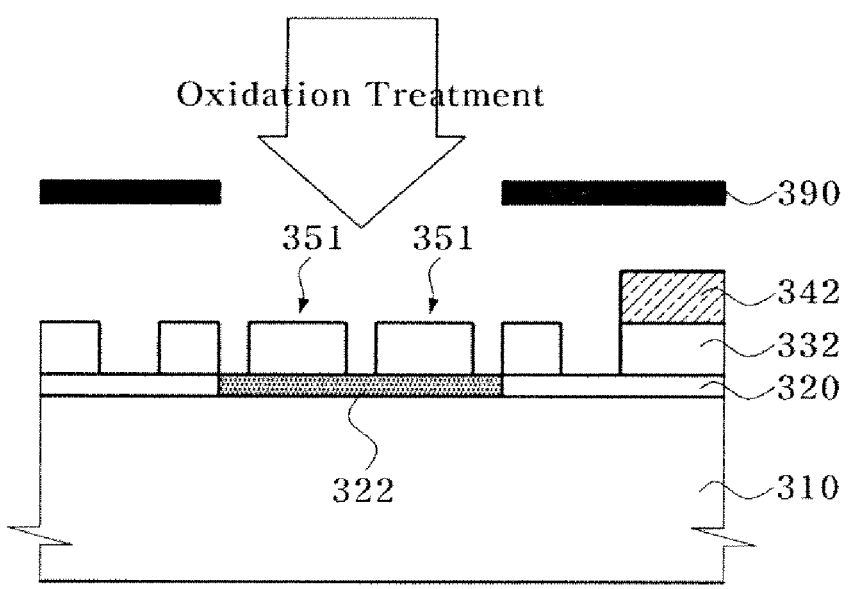

Next, as shown in FIG. 10, oxidation treatment is selectively performed by the calculated oxidation level on some portion of the light transmittance control layer 120, i.e. the light transmitting region adjacent to the poor phase shift layer pattern 351. The light transmittance in the oxidized region 322 formed by the oxidation treatment is higher than the light transmittance in the non-oxidized region. The oxidation treatment is preferably performed using an oxygen ion implantation process using a blocking layer 370. In another example, the oxidation treatment may be performed using a thermal oxidation method.

While the invention has been described with respect to the specific embodiments, various changes and modifications may be made without departing from the spirit and scope of the invention as defined in the following claims.

What is claimed is:

1. A photomask, comprising:
   a light transmitting substrate;
   patterns disposed over the light transmitting substrate to define a light transmitting region of the substrate; and
   a light transmittance control layer disposed between the light transmitting substrate and the patterns, said control layer having a relatively high light transmittance in a first control layer region overlapping a first portion of the light transmitting region adjacent to a poor pattern having a size larger than a normal size, said control layer having a relatively low light transmittance in a second control layer region overlapping a second portion of the light transmitting region disposed between normal patterns having a normal size wherein the light transmitting control layer comprises a material having light transmittance that varies with an oxidation level of the material with a relatively high light transmittance in an oxidized portion of the layer compared to a non-oxidized portion of the layer.

2. The photomask of claim 1, wherein the light transmittance control layer material comprises cobalt (Co), silicon (Si), tantalum (Ta) or molybdenum (Mo).

3. The photomask of claim 1, wherein the light transmittance control layer has a structure wherein the first region is oxidized.

4. The photomask of claim 1, wherein the patterns include light blocking layer patterns or a phase shift layer pattern.

5. A photomask, comprising:
   a light transmitting substrate;
   patterns disposed over a first surface of the light transmitting substrate to define a light transmitting region; and
   a light transmittance control layer disposed over a second surface of the light transmitting substrate opposed to the first surface and having a relatively high light transmittance in a first control layer region overlapping a first portion of the light transmitting region adjacent to a poor pattern having a size larger than a normal size than in a second control layer region overlapping a second portion of the light transmitting region between normal patterns having a normal size wherein the light transmitting control layer comprises a material having light transmittance that varies with an oxidation level of the material with a relatively high light transmittance in an oxidized portion of the layer compared to a non-oxidized portion of the layer.

6. A method of fabricating a photomask, comprising:
   forming a light transmittance control layer having a light transmittance controlled by an oxidation level thereof over a light transmitting substrate;
   forming patterns defining a light transmitting region over the light transmittance control layer;
   measuring a critical dimension (CD) error of a poor pattern having a size larger than a normal size by inspecting a CD of the patterns;
   calculating the oxidation level of the light transmittance control layer by analyzing the measured CD error; and
   selectively oxidizing a portion of the light transmittance control layer overlapping the light transmitting region adjacent to the poor pattern by the calculated oxidation level wherein the light transmittance control layer comprises a material having light transmittance that varies with an oxidation level of the material with a relatively high light transmittance in an oxidized portion of the layer compared to a non-oxidized portion of the layer.

7. The method of claim 6, wherein the light transmittance control layer comprises a material selected from the group consisting of cobalt (Co), silicon (Si), tantalum (Ta), and molybdenum (Mo).

8. The method of claim 6, comprising forming the patterns of light blocking layer patterns or a phase shift layer pattern.

9. The method of claim 6, comprising calculating the oxidation level of the light transmittance control layer by analyzing the measured CD error by:
   calculating a CD correction amount by comparing the measured CD with a reference value;
   calculating a transmittance corresponding to the calculated CD correction amount; and
   calculating the oxidation level corresponding to the calculated transmittance.

10. The method of claim 6, comprising selectively oxidizing the light transmittance control layer using a thermal oxidation method or an oxygen ion implantation method.

11. A method of fabricating a photomask, comprising:
   forming a light transmittance control layer having a light transmittance controlled by an oxidation level thereof over a rear surface of a light transmitting substrate;
   forming patterns defining a light transmitting region over a front surface of the light transmittance control layer;
   measuring a critical dimension (CD) error of a poor pattern having a size larger than a normal size by inspecting a CD of the patterns;
   calculating the oxidation level of the light transmittance control layer by analyzing the measured CD error; and selectively oxidizing a portion of the light transmittance control layer overlapping the light transmitting region adjacent to the poor pattern by the calculated oxidation level wherein the light transmitting control layer comprises a material having light transmittance that varies with an oxidation level of the material with a relatively high light transmittance in an oxidized portion of the layer compared to a non-oxidized portion of the layer.

* * * * *